United States Patent
Phang et al.

(10) Patent No.: US 7,443,204 B2
(45) Date of Patent: Oct. 28, 2008

(54) COMMON-MODE NOISE-REDUCED OUTPUT TRANSMITTER

(75) Inventors: Kian Leong Phang, Penang (MY); Fei Deng, Folsom, CA (US)

(73) Assignee: Intel Corporation, Santa Clara, CA (US)

( * ) Notice: Subject to any disclaimer, the term of this patent is extended or adjusted under 35 U.S.C. 154(b) by 98 days.

(21) Appl. No.: 11/477,684

(22) Filed: Jun. 28, 2006

(65) Prior Publication Data

US 2008/0001630 A1    Jan. 3, 2008

(51) Int. Cl.
*H03K 19/0175* (2006.01)
(52) U.S. Cl. .......................................... 326/87; 326/86
(58) Field of Classification Search ................... 326/68, 326/83, 86–87; 327/108, 109
See application file for complete search history.

(56) References Cited

U.S. PATENT DOCUMENTS

| 6,680,681 | B1 * | 1/2004 | Hsu et al. ................... 341/144 |
| 7,265,620 | B2 * | 9/2007 | Liu et al. .................... 330/253 |
| 2007/0112992 | A1 * | 5/2007 | Schanke et al. ............. 710/307 |

* cited by examiner

*Primary Examiner*—James H Cho
(74) *Attorney, Agent, or Firm*—Lee & Hayes, PLLC

(57) ABSTRACT

Various embodiments provide a high speed serial transmitter that utilizes a current-mode driver comprising a main driver and a de-emphasis driver. The de-emphasis driver includes a first driver circuit and a complementary second driver circuit that is operably coupled with the first driver circuit. Collectively, the first driver circuit and its complementary second driver circuit work in concert to compensate to correct the lower output common-mode level in de-emphasized bits.

6 Claims, 12 Drawing Sheets

COMMON-MODE NOISE-REDUCED OUTPUT TRANSMITTER

BACKGROUND

Some high speed serial I/O transmitters utilize de-emphasis or pre-emphasis circuits. Such high speed serial implementations can include systems designed in accordance with the PCI (Peripheral Component Interconnect) Express™ Base Specification Revision 1.1, dated Mar. 28, 2005, Serial Advanced Technology Attachment (ATA) systems and others. In at least some of these implementations, the finite output impedance of the current source used in current-mode drivers can result in varying current depending on the voltage on the output of the current source. This can produce higher current in de-emphasized bits and lower current in normalized or pre-emphasized bits. Therefore, the output common-mode for de-emphasized bits is at a lower level as compared with the normalized or pre-emphasized bits. For advanced fabrication processes such as 90 nm and beyond, the output impedance of the current source is further reduced. The mismatch in the output common-mode results in large common-mode noise. In some instances, this large common-mode noise can exceed that which is allowed or desirable in view of certain high speed serial interface applications.

DETAILED DESCRIPTION

Various embodiments provide a high speed serial transmitter that utilizes a current-mode driver comprising a main driver and a de-emphasis driver. The de-emphasis driver includes a first driver circuit and a complementary second driver circuit that is operably coupled with the first driver circuit. Collectively, the first driver circuit and its complementary second driver circuit work in concert to compensate to correct the lower output common-mode level in de-emphasized bits. This, in turn, can reduce the output common-mode noise, as will become apparent below.

Figure 1:
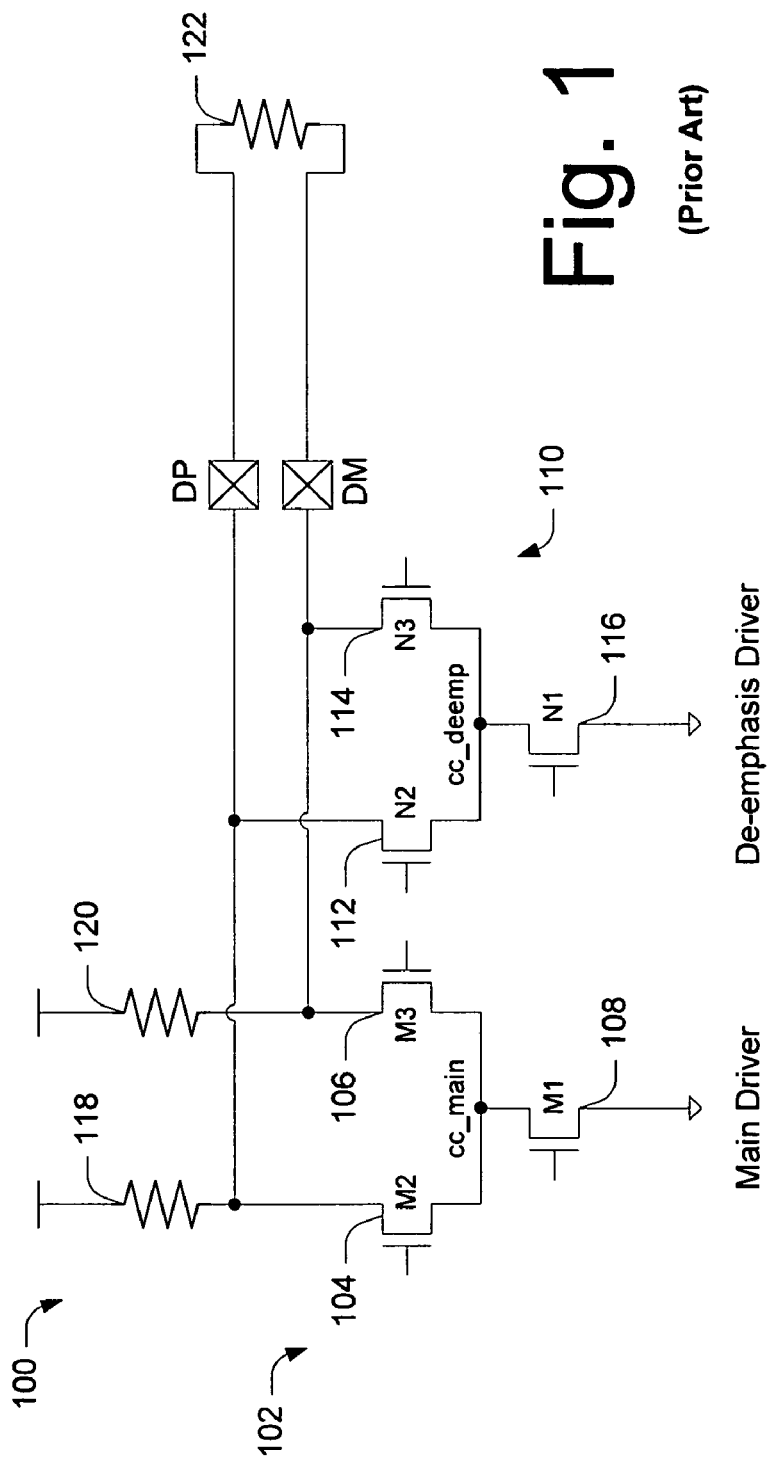
FIG. 1 illustrates a current-mode driver that is implemented in NMOS.

As some background for an appreciation of common-mode noise, FIG. 1 illustrates, generally at 100, a current-mode driver. In this example, current-mode driver 100 is implemented as an NMOS current mode driver. Current mode driver 100 includes a main driver 102 made up of transistors 104, 106 and 108, and a de-emphasis driver 110 made up of transistors 112, 114, and 116. In this example, resistors 118, 120 are operably connected with main driver 102 and de-emphasis driver 110 as shown. A differential resistor 122 is connected as the load.

In this arrangement, transistor 108 acts as a current source for main driver 102, and transistor 116 acts as a current source for de-emphasis driver 110.

Figure 2:
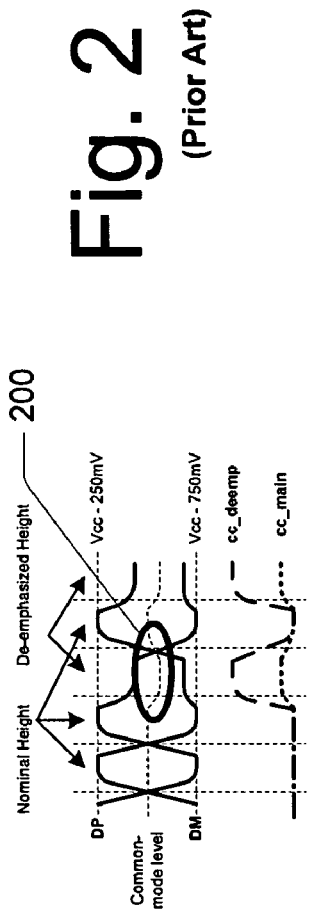
FIG. 2 illustrates the output common-mode level variation of the FIG. 1 circuit.

FIG. 2 illustrates the voltage variation on the drains of the current sources, cc_main and cc_deemp, which results in output common-mode level variation. In this example, notice that there are three areas designated as "nominal height" which occur at the voltage level $V_{cc}$=−250 mV. Notice also that there are two areas designated "de-emphasized height" which occur between −250 mV and −750 mV. Notice also that just before the first area of de-emphasized height, the common n-mode level begins to dip. This region of variation is designated at 200 and constitutes the undesirable common-mode noise.

Figure 3:
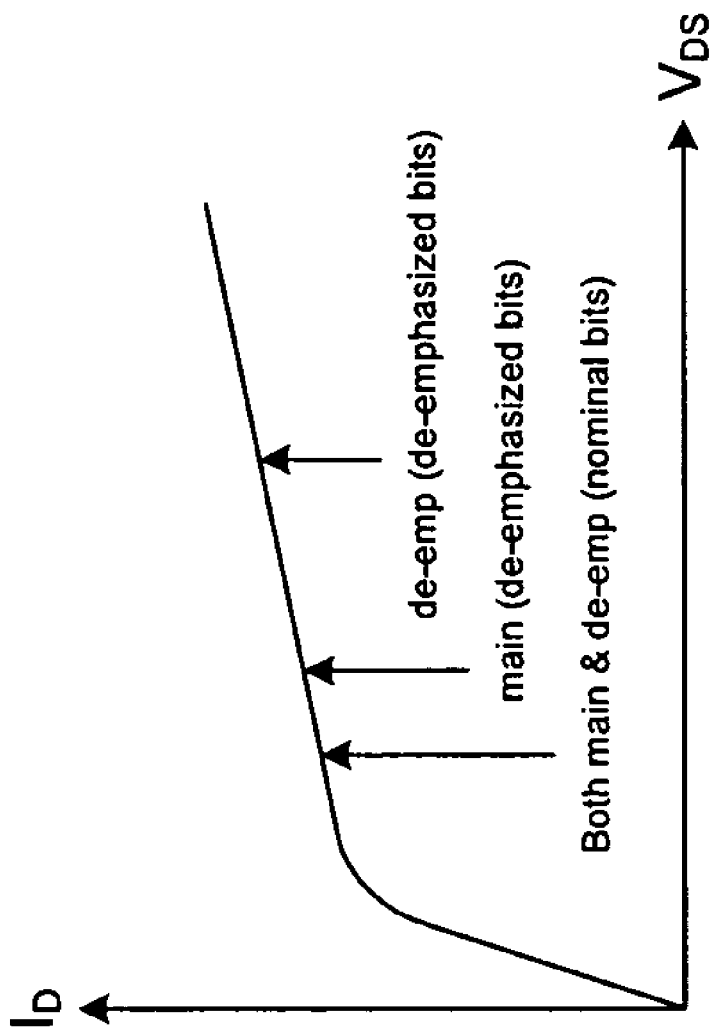
FIG. 3 illustrates the IV curve for the main and de-emphasis current source operating points during normal and de-emphasized bits.

FIG. 3 illustrates the IV curve that shows the current source operating point for each of the main and de-emphasis drivers 102, 110 (FIG. 1) during nominal and de-emphasized bit operation. The relevance of this IV curve will become apparent below in connection with FIG. 10.

Exemplary Current-Mode Driver Embodiment

Figure 4:
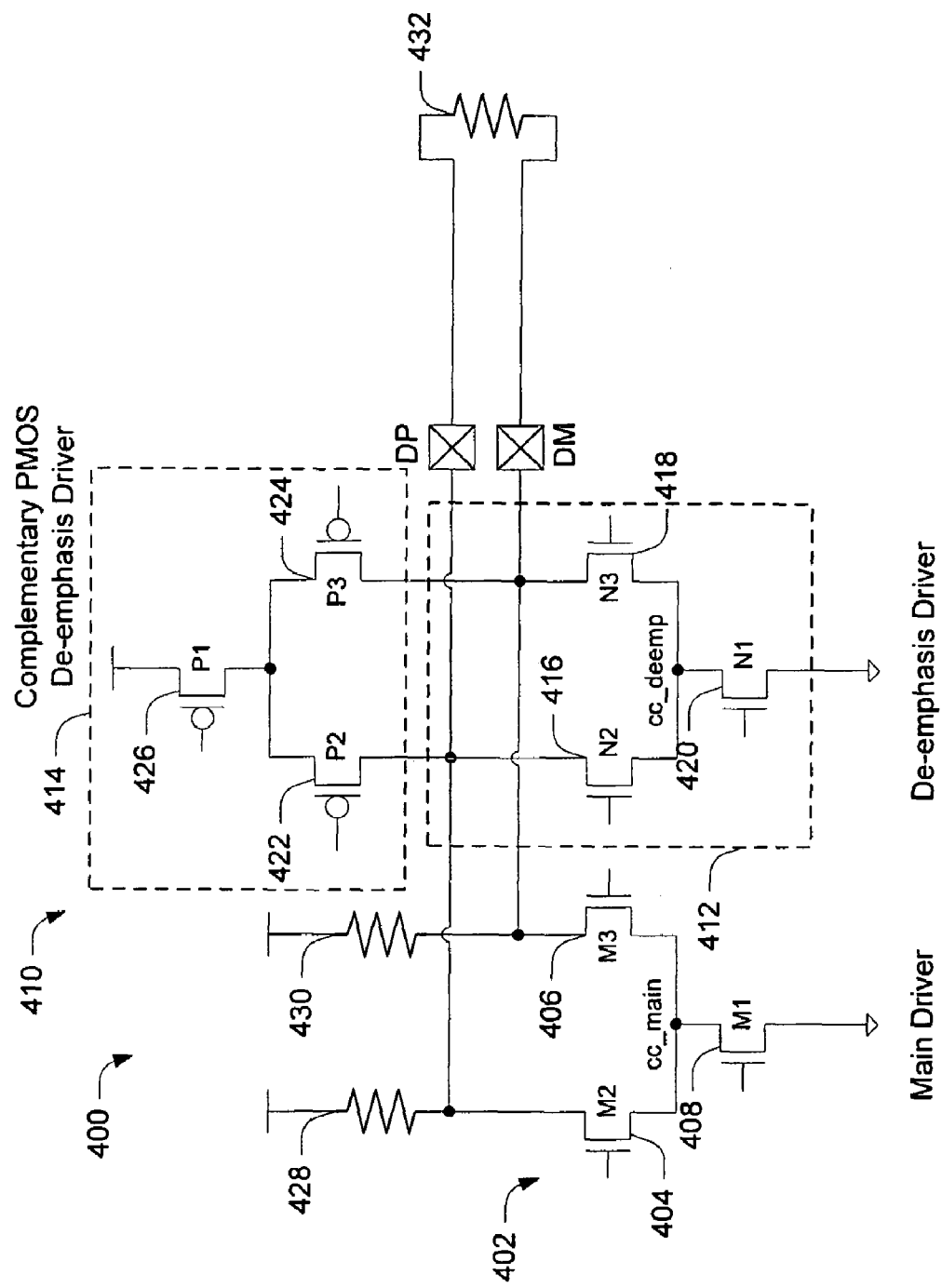
FIG. 4 illustrates a current-mode driver in accordance with one embodiment.

FIG. 4 illustrates a current-mode driver in accordance with one embodiment generally at 400. In this example, current-mode driver 400 includes a main driver 402 made up of field effect transistors 404, 406, and 408. Here, transistor 408 acts as a current source for main driver 402.

In addition, current-mode driver 400 includes a de-emphasis driver 410 made up of a first driver circuit 412 and a second complementary driver circuit 414. In this example, first driver circuit 412 includes first and second field effect transistors 416, 418 coupled to a field effect transistor 420 that acts as a current source for de-emphasis driver 410. Further, in this embodiment, second complementary driver circuit 414 includes first and second field effect transistors 422, 424 coupled to a field effect transistor 426. First transistors 416, 422 are coupled together, as are second transistors 418, 424 as shown.

In this particular embodiment, first driver circuit 412 is implemented as an NMOS circuit while second complementary driver circuit 414 is implemented as a PMOS circuit. It is to be appreciated and understood, however, that main driver 402 and first driver circuit 412 could be implemented as PMOS circuits and second complementary driver circuit 414 could be implemented as an NMOS circuit without departing from the spirit and scope of the claimed subject matter.

In this example, current-mode driver 400 includes resistors 428, 430 operably connected as shown to main driver 402 and de-emphasis driver 412. In addition, a differential resistor 432 is connected as a load resistor.

In the illustrated and described embodiment, the second complementary driver circuit or complementary PMOS de-emphasis driver 414 is complementary to the NMOS de-emphasis driver 412. In operation, the PMOS current source is also subjected to a finite output impedance. Therefore, as will be appreciated by the skilled artisan, its complementary nature will compensate to correct the lower output mode level in the de-emphasized bits.

Further, characteristics of this circuit include that in at lease some embodiments, current-mode driver 400 does not impede the $V_{cc}$ headroom of the current-mode driver as compared with a cascode current source. In addition, the illustrated circuit is able to work with a lower $V_{cc}$ supply. Furthermore, using this particular circuit, part of the total driver current is shifted to the complementary PMOS driver thus resulting in a lower total $I_{cc}$ dissipation. Moreover, the illustrated and described circuit also produces a higher output common-mode level for the AC coupled output swing. This results in more $V_{cc}$ headroom for the main and de-emphasis NMOS current sources 402, 412.

In Operation

Figure 5:
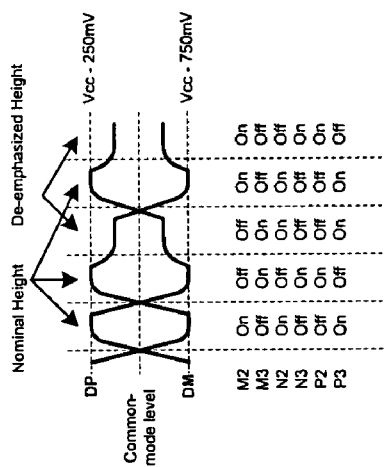
FIG. 5 illustrates the driver switching operation of the FIG. 4 circuit.

FIG. 5 illustrates the switching operation of various transistors from current-mode driver circuit 400.

More specifically, the switching operations of transistors 404 (m2), 406 (m3), 416 (n2), 418 (n3), 422 (p2) and 424 (p3) are shown. In addition to the switching operations of the various transistors, a corresponding output common-mode level variation is shown for the various states at which the transistors can be driven. Notice here, that there are three areas designated as "nominal height" just as in FIG. 2. Likewise, two areas are designated as "de-emphasized height", just as in FIG. 2. In this example, however, notice that there is no corresponding dip in the common-mode level, as there was in FIG. 2. As such, the noise which was manifest as the dip in the common-mode level of FIG. 2 has been removed or otherwise mitigated.

Figure 6:
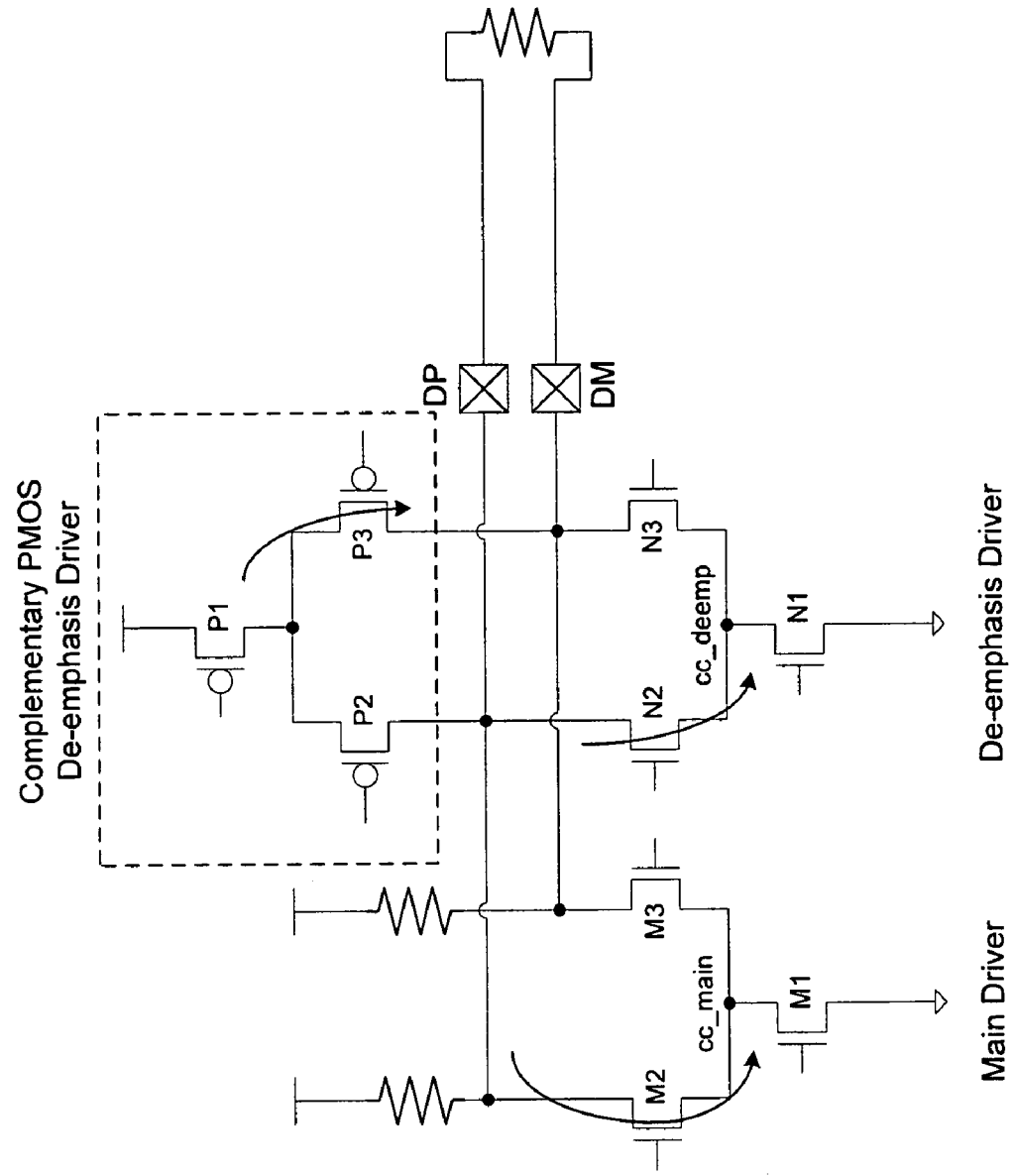
FIG. 6 illustrates the driver current flow during transmission of the nominal bit.
Figure 7:
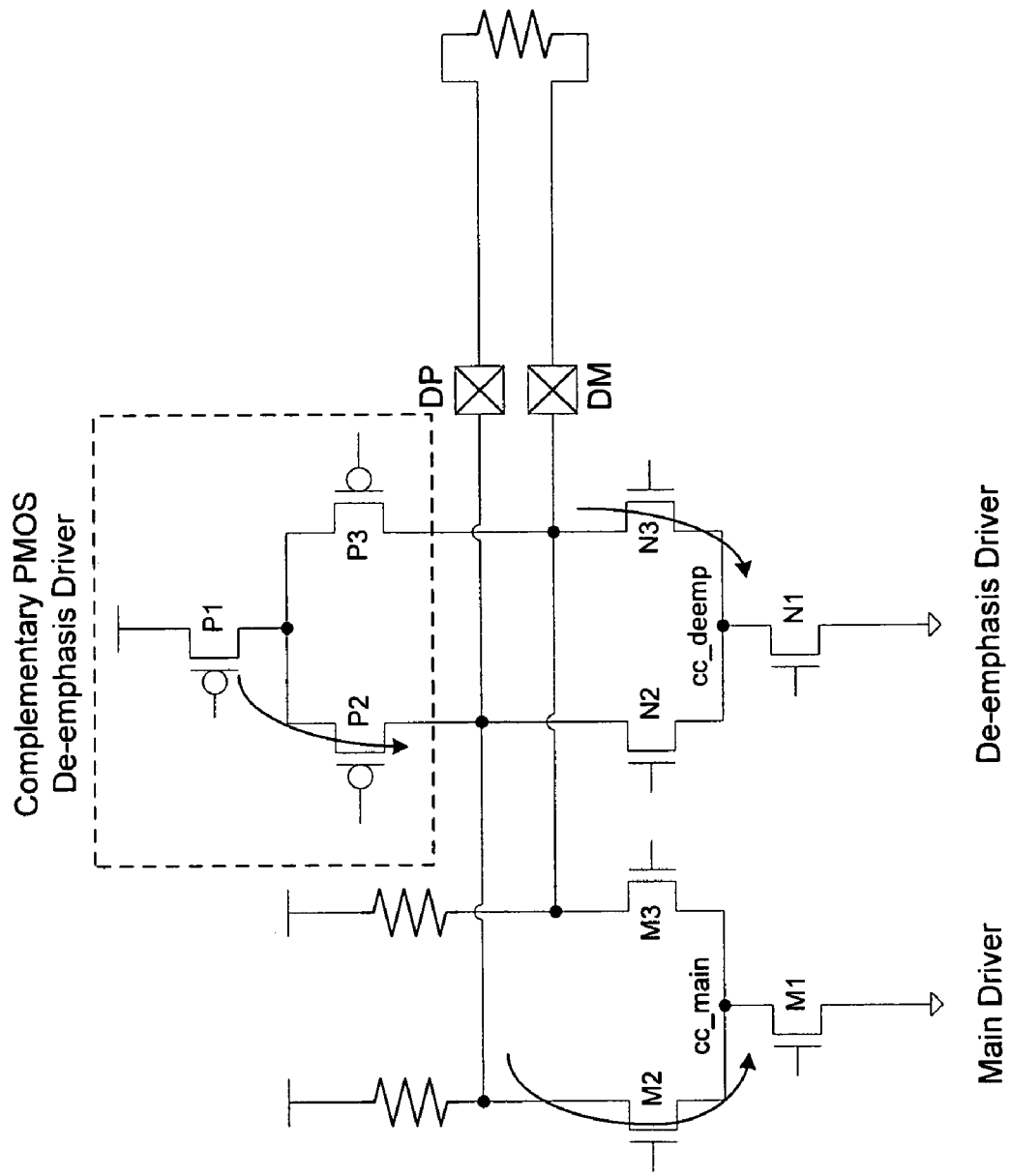
FIG. 7 illustrates the driver current flow during transmission of the de-emphasized bit.

FIGS. 6 and 7 show the flow of current through the current mode driver during transmission of the nominal bit and de-emphasized bit, respectively.

Here, the flow of current in the PMOS driver is complementary to the flow of current in the NMOS de-emphasis driver. The driver switching operation of FIG. 5 can be easily mapped to the current flow illustrations of FIGS. 6 and 7. For example, the current flow of FIG. 6 takes place when transistors m2, n2 and p3 are on. This is current flow that corresponds to transmission of the nominal bit. Likewise, the current flow illustrated in FIG. 7 corresponds to operation of the circuit when m2, n3, and p2 are on. This corresponds to the driver current flow during transmission of the de-emphasized bit.

Figure 8:
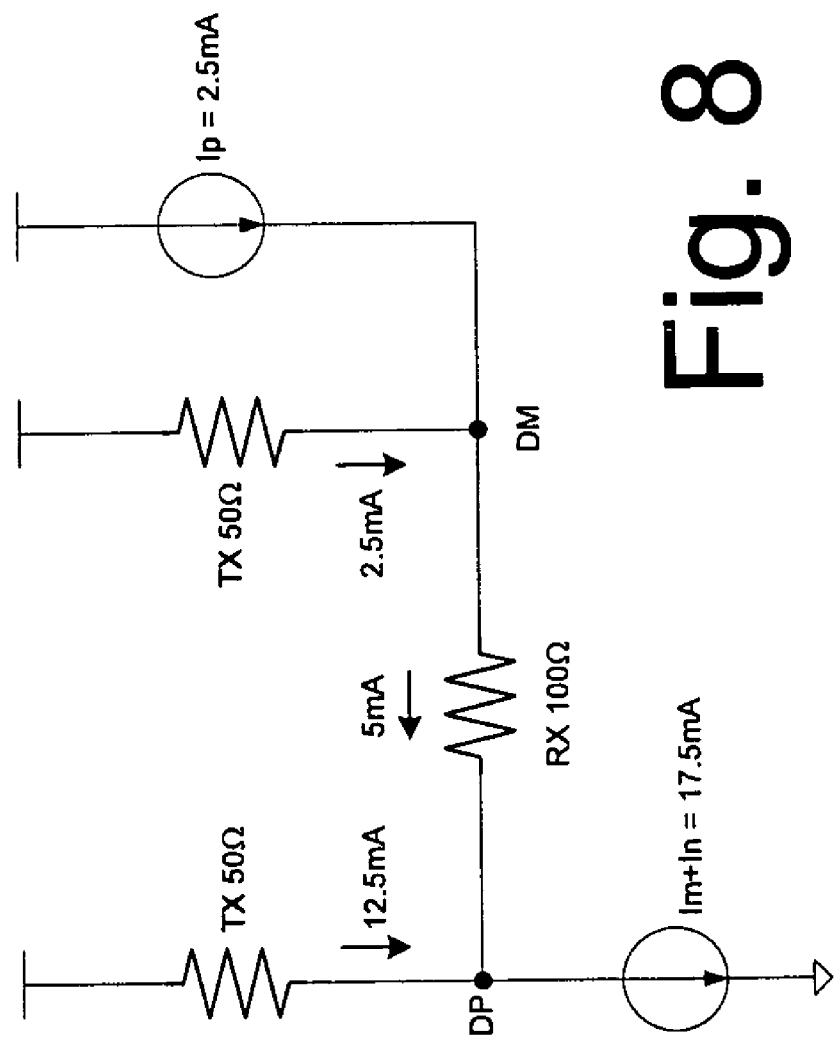
FIG. 8 illustrates the nominal bit transmit equivalent circuit.
Figure 9:
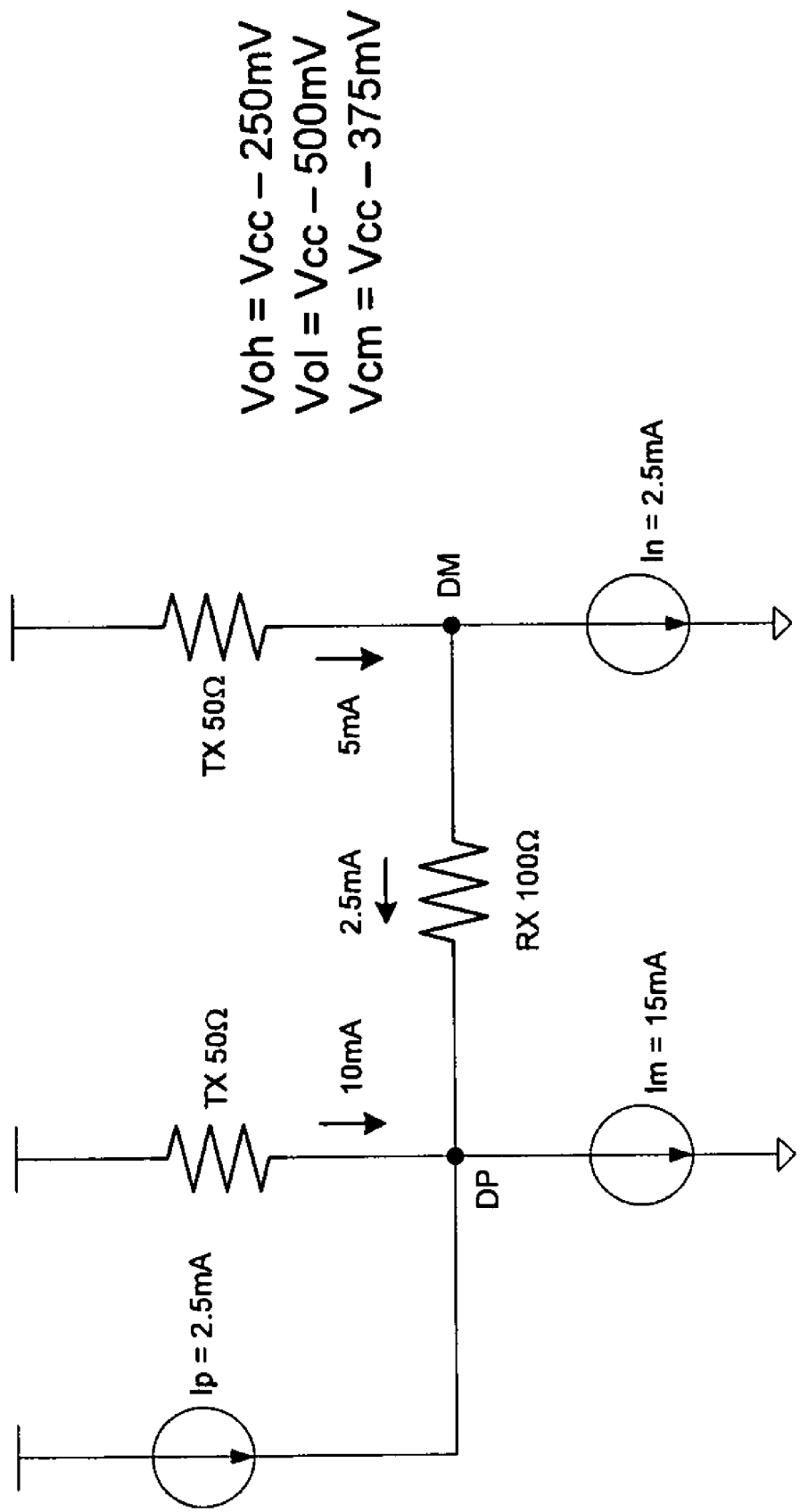
FIG. 9 illustrates the de-emphasized bit transmit equivalent circuit.

FIGS. 8 and 9 show the simplified equivalent circuit of the driver and a far-end receiver termination during nominal bit and de-emphasized bit transmit states respectively. In this example, the main driver current, Im equals 15 mA, de-emphasis NMOS driver current, In equals 2.5 mA and PMOS driver current, Ip equals 2.6 mA. In this example, this is to satisfy two criteria. First, Im+In+Ip=20 mA, to achieve a 1 Vdiff-pk-pk output swing. Second, In+Ip=5 mA to achieve −6 dB de-emphasis ratio.

From FIGS. 8 and 9, it should be apparent to the skilled artisan that the output common-mode voltage Vcm is raised higher as compared to a conventional driver without the complementary de-emphasis driver. However, the swing amplitude and de-emphasis ratio are maintained.

Figure 10:
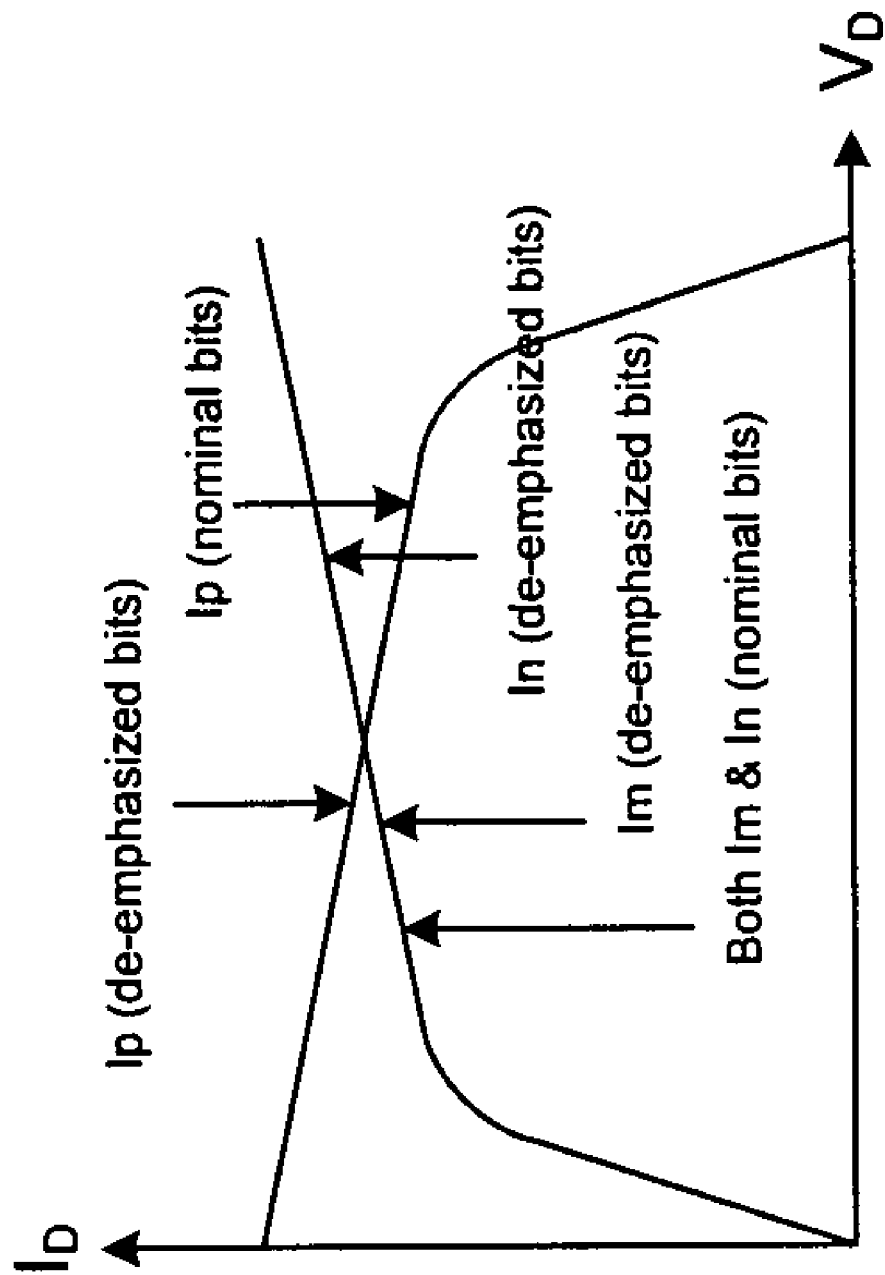
FIG. 10 illustrates the IV curve of the main and de-emphasis current source operating points.

The PMOS driver current source is also subjected to finite output impedance similar to the NMOS main and de-emphasis driver current sources. During de-emphasized bit transmission, the PMOS current source also experiences an increase in current as shown in FIG. 10. This increase in current will pull the de-emphasized bit common-mode higher and cancel out the common-mode change due to the current increase in the NMOS current source which pulls the de-emphasized bit common mode lower. Optimal or desired counteracting of the common-mode dictates the sizing of the. PMOS driver strength.

Exemplary Method

Figure 11:
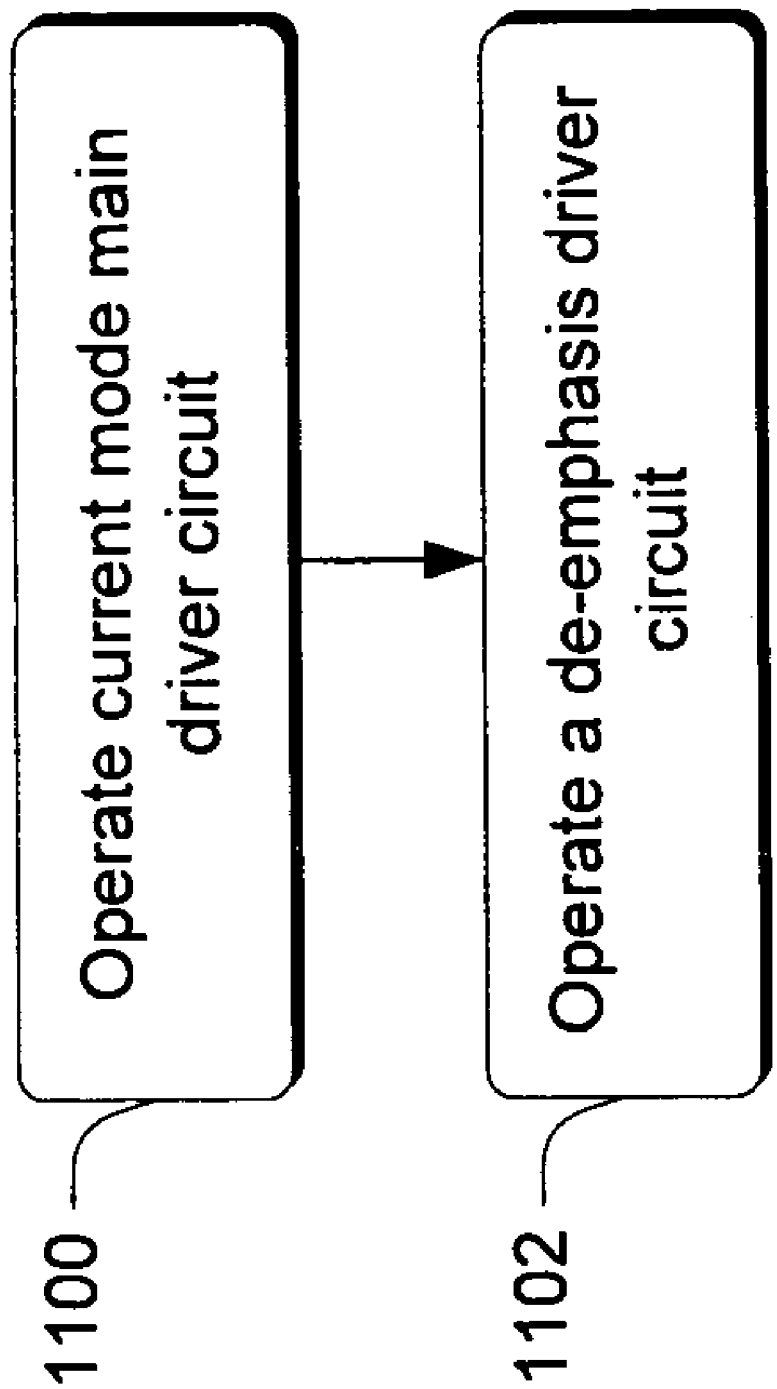
FIG. 11 is a flow diagram that describes acts in accordance with one embodiment.

FIG. 11 is a flow diagram that describes acts in accordance with one embodiment. The method can be implemented in connection with any suitable hardware, software, firmware or combination thereof. In but one embodiment, the method can be implemented in connection with circuits, such as those described above.

A current mode main driver circuit is operated, at 1100, to provide a main driver current. An example of a current mode main driver circuit is provided above. Other circuits can be used without departing from the spirit and scope of the claimed embodiments. A de-emphasis driver circuit is operated, at 1102, to provide a de-emphasis driver current. An example of a de-emphasis driver circuit is provided above, along with an exemplary switching operating. Other circuits can be used without departing from the spirit and scope of the claimed embodiments.

Implementation Example

In the discussion that follows, an exemplary implementation example is described in which the various embodiments described above can be implemented. It is to be appreciated and understood that this implementation example is not to be used to limit application of the claimed subject matter. Rather, the inventive embodiments can be employed in other scenarios without departing from the spirit and scope of the claimed subject matter.

The system described just below is that of a PCI (Peripheral Component Interconnect) Express system which conforms to the PCI Express™ Base Specification Revision 1.1, dated Mar. 28, 2005. It is to be appreciated and understood that the inventive embodiments can be utilized in other systems, other than PCI Express systems, without departing from the spirit and scope of the claimed subject matter. These other systems can include, by way of example and not limitation, systems that utilize electrical interfaces that employ transmitter de-emphasis or pre-emphasis schemes, such as those interfaces that run at data transfer rates of 1 GB/s or higher. Specific, non-limiting examples of other systems include, by way of example and not limitation, Serial Advanced Technology Attachment (ATA), Serial Digital Video Out (SDVO), Unified Display Interface (UDI) and High-Definition Multimedia Interface (HDMI) systems.

Portions of the discussion that appears just below have been incorporated from the PCI Express™ Base Specification Revision 1.1.

PCI Express is a high performance, general purpose I/O interconnect defined for a wide variety of computing and communication platforms. PCI Express maintains some PCI attributes, such as its usage model, load-store architecture, and software interfaces, whereas its parallel bus implementation is replaced by a highly scalable, fully serial interface.

Figure 12:
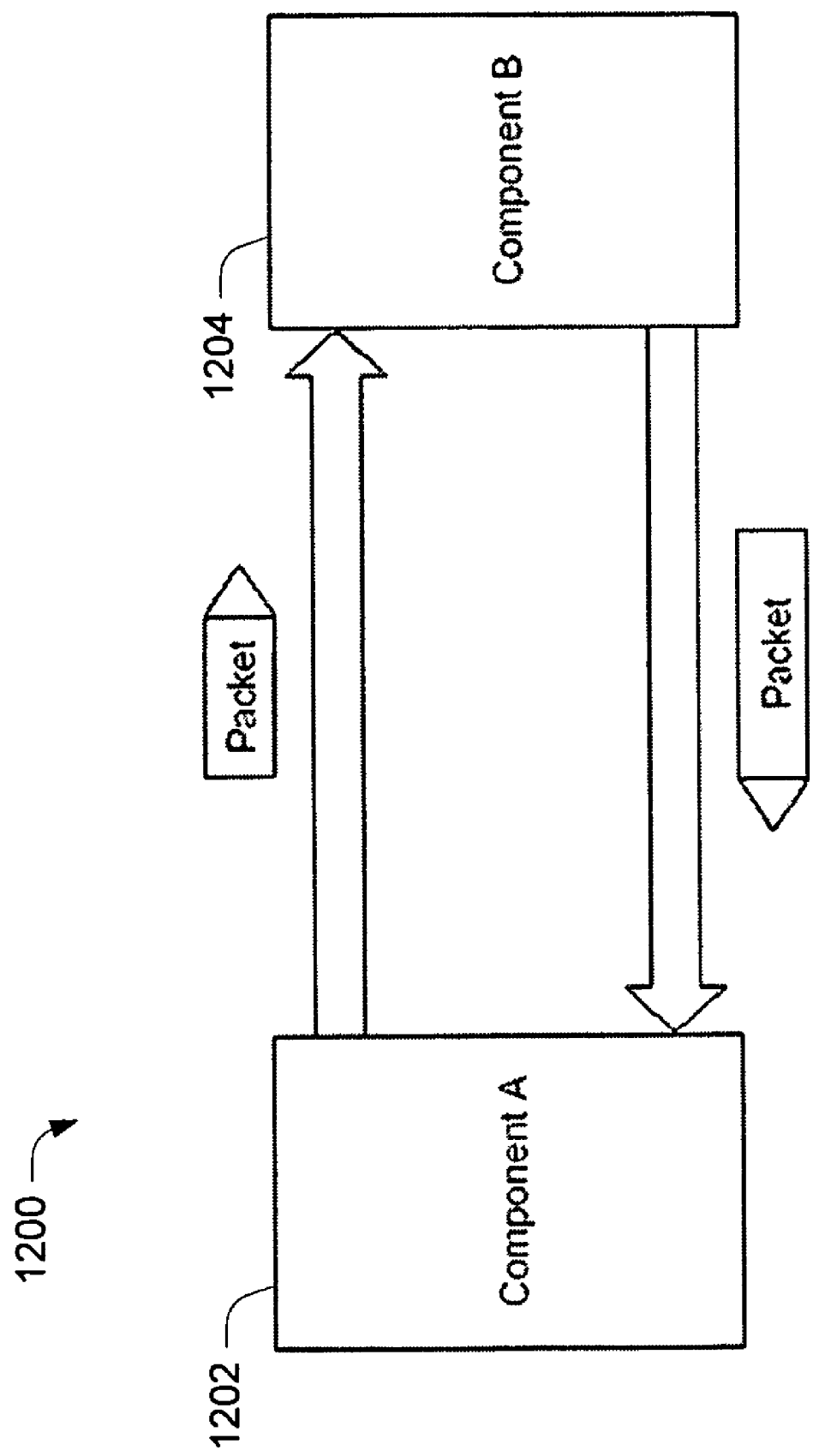
FIG. 12 illustrates a PCI Express Link in connection with which one or more embodiments can be employed.

FIG. 12 illustrates, generally at 1200, a basic PCI Express concept known as a Link. A Link represents a dual-simplex communications channel between two components 1202, 1204. The fundamental PCI Express Link consists of two, low-voltage, differentially driven signal pairs: a Transmit pair and a Receive pair. A data clock is embedded using an encoding scheme to achieve very high data rates.

Figure 13:
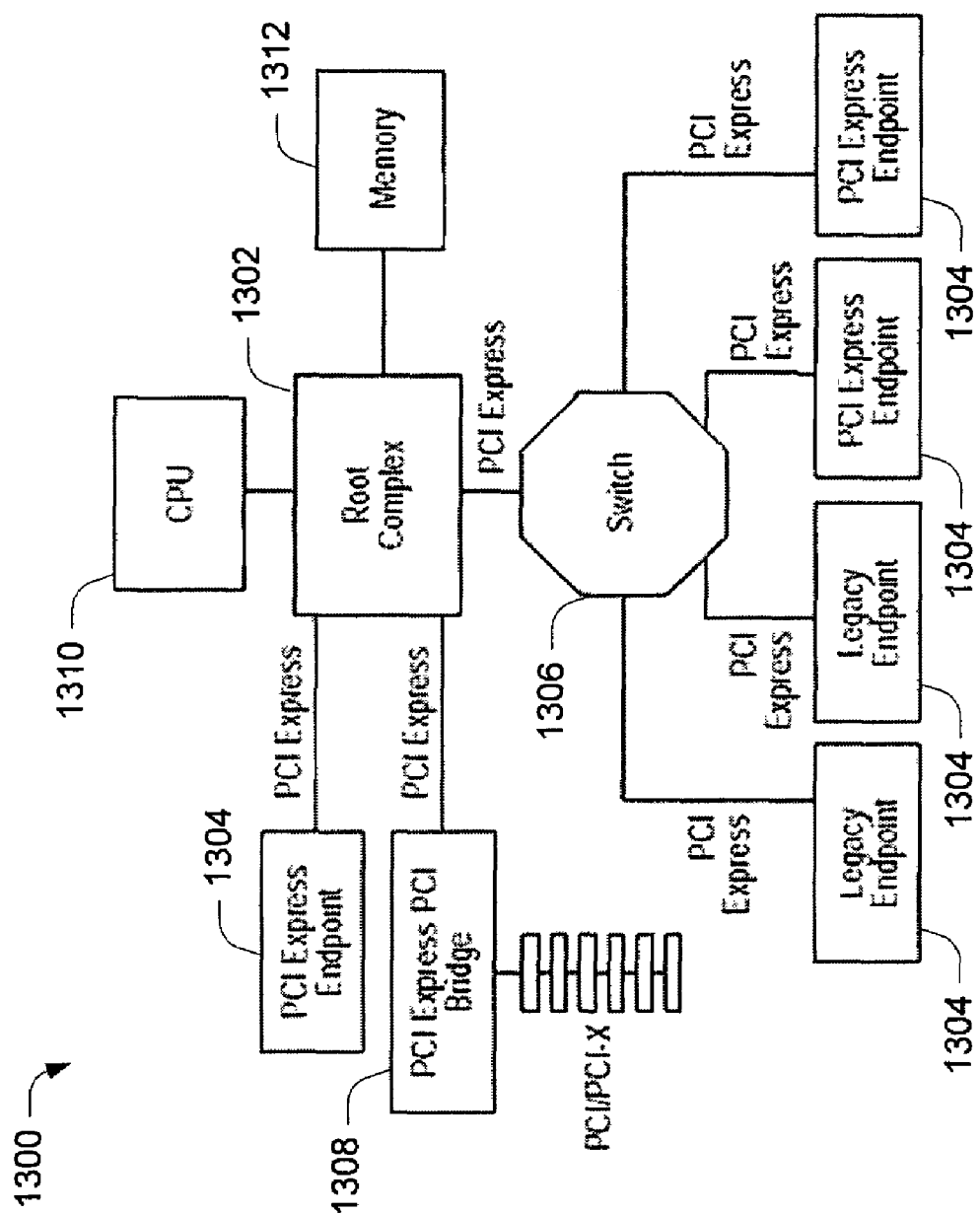
FIG. 13 illustrates an exemplary PCI Express fabric topology in connection with which one or more embodiments can be employed.

A PCI Express fabric is composed of point-to-point Links that interconnect a set of components. One example of a fabric topology is shown in FIG. 13, generally at 1300. This figure illustrates a single fabric instance referred to as a hierarchy—composed of a Root Complex (RC) 1302, multiple Endpoints (I/O devices) 1304, a Switch 1306, and a PCI Express-PCI Bridge 1308, all interconnected via PCI Express Links. Topology 1300 also includes, in this example, CPU 1310 and memory 1312.

Root Complex (RC) 1302 denotes the root of an I/O hierarchy that connects the CPU/memory 1310/1312 subsystem to the I/O. As illustrated in FIG. 13, a Root Complex may support one or more PCI Express Ports. Each interface defines a separate hierarchy domain each of which may be composed of a single Endpoint or a sub-hierarchy containing one or more Switch components and Endpoints.

An Endpoint 1304 refers to a type of device that can be the Requester or Completer of a PCI Express transaction either on its own behalf or on behalf of a distinct non-PCI Express device (other than a PCI device or Host CPU), e.g., a PCI Express attached graphics controller or a PCI Express-USB host controller. Endpoints are classified as either legacy, PCI Express, or Root Complex Integrated Endpoints.

A Switch 1306 is defined as a logical assembly of multiple virtual PCI-to-PCI Bridge devices.

Figure 14:
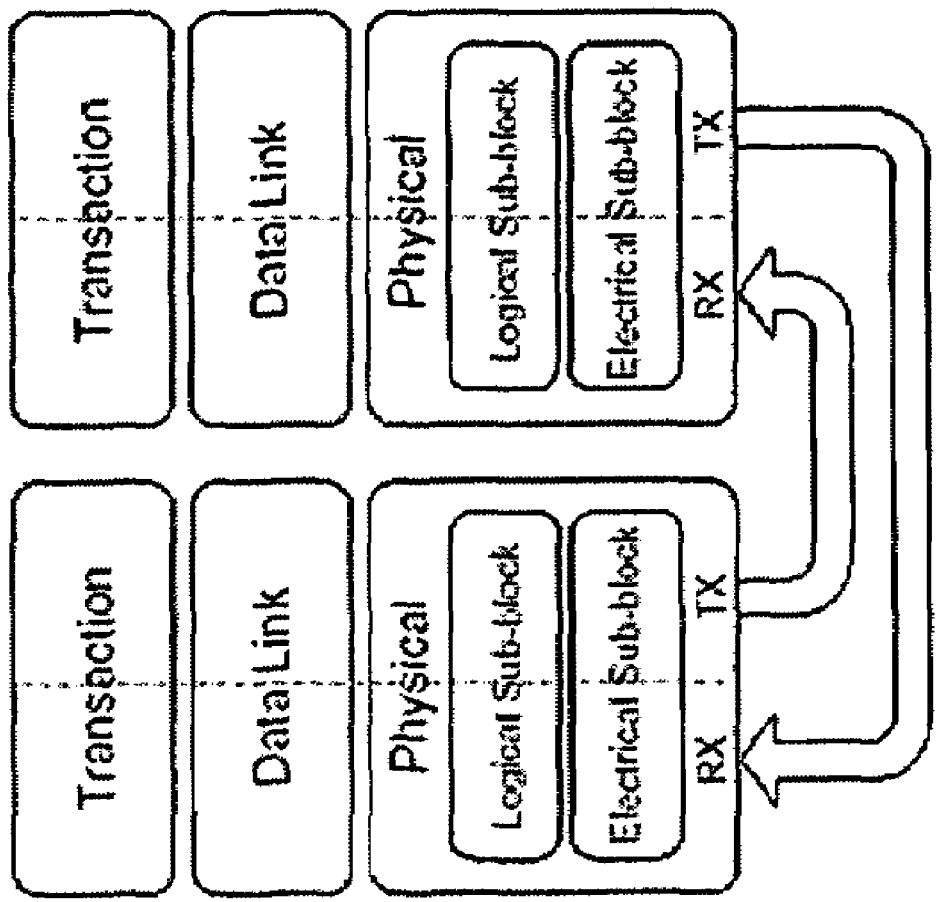
FIG. 14 illustrates a layering overview that describes a PCI Express architecture in connection with which one or more embodiments can be employed.

FIG. 14 provides a layering overview that specifies the PCI Express architecture in terms of three discrete logical layers: the Transaction Layer, the Data Link Layer, and the Physical Layer. Each of these layers is divided into two sections: one that processes outbound (to be transmitted) information and one that processes inbound (received) information, as shown in FIG. 14.

PCI Express uses packets to communicate information between components. Packets are formed in the Transaction and Data Link Layers to carry the information from the transmitting component to the receiving component. As the transmitted packets flow through the other layers, they are extended with additional information necessary to handle packets at those layers. At the receiving side the reverse process occurs and packets get transformed from their Physical Layer representation to the Data Link Layer representation and finally (for Transaction Layer Packets) to the form that can be processed by the Transaction Layer of the receiving device.

The upper Layer of the architecture is the Transaction Layer. The Transaction Layer's primary responsibility is the assembly and disassembly of Transaction Layer Packets (TLPs). TLPs are used to communicate transactions, such as read and write, as well as certain types of events. The Transaction Layer is also responsible for managing credit-based flow control for TLPs.

The middle Layer in the stack, the Data Link Layer, serves as an intermediate stage between the Transaction Layer and the Physical Layer. The primary responsibilities of the Data Link Layer include Link management and data integrity, including error detection and error correction. The transmission side of the Data Link Layer accepts TLPs assembled by the Transaction Layer, calculates and applies a data protection code and TLP sequence number, and submits them to the Physical Layer for transmission across the Link. The receiving Data Link Layer is responsible for checking the integrity of received TLPs and for submitting them to the Transaction Layer for further processing. On detection of TLP error(s), this Layer is responsible for requesting retransmission of TLPs until information is correctly received, or the Link is determined to have failed.

The Physical Layer includes all circuitry for interface operation, including driver and input buffers, parallel-to-serial and serial-to-parallel conversion, PLL(s), and impedance matching circuitry. It includes also logical functions related to interface initialization and maintenance. The Physical Layer exchanges information with the Data Link Layer in an implementation-specific format. This Layer is responsible for converting information received from the Data Link Layer into an appropriate serialized format and transmitting it across the PCI Express Link at a frequency and width compatible with the device connected to the other side of the Link.

The current mode driver described above resides at this layer of the PCI Express system.

Conclusion

The above-described embodiments can be utilized in high-speed serial I/O transmitter scenarios that utilize de-emphasis or pre-emphasis techniques. The illustrated and described embodiments can be utilized to address and mitigate the large output common-mode noise that is seen on various drivers due to the poor output impedance of transistors in the saturation region. The various embodiments described above have particular utility in advanced fabrication processes such as 90 nanometer processes and beyond.

What is claimed is:

1. A circuit comprising:
    a serial I/O transmitter comprising:
        a current-mode driver comprising:
            a main driver, the main driver comprising a first and second PMOS field effect transistors coupled to a current source PMOS field effect transistor, wherein a first resistor is serially coupled to the first PMOS field effect transistor and a second resistor is serially coupled to the second PMOS field effect transistor; and
            a de-emphasis driver having a first driver circuit and a complementary second driver circuit coupled to the first driver circuit:
                the first driver circuit comprising a first and second PMOS field effect transistor coupled to a current source PMOS field effect transistor, wherein the first resistor of the main drive is coupled serially with the first PMOS field effect transistor of the first drive circuit and the second resistor of the main drive circuit is serially connected to the second PMOS field effect transistor of the first drive circuit;
                the complementary second driver circuit comprising a first and second NMOS field effect transistor coupled to a third NMOS field effect transistor, the first NMOS field effect transistor individually coupled to the first PMOS field effect transistor of the first driver circuit and the second NMOS field effect transistor individually coupled to the second PMOS field effect transistor of the first driver circuit.

2. The circuit of claim 1, wherein the first driver circuit comprises NMOS field effect transistors and the complementary second driver circuit comprises PMOS field effect transistors.

3. The circuit of claim 1, wherein the circuit is implemented in a PCI Express system.

4. A system comprising:
    a root complex;
    a CPU coupled to the root complex;
    memory coupled to the root complex;
    one or more endpoint devices;

one or more PCI Express Links to couple the one or more endpoint devices to the root complex, wherein individual PCI Express Links comprise one or more serial transmitters comprising:
an PMOS main driver, the PMOS main driver comprising a first and second PMOS field effect transistors coupled to a current source PMOS field effect transistor, wherein a first resistor is serially coupled to the first NMOS field effect transistor and a second resistor is serially coupled to the second NMOS field effect transistor; and
a de-emphasis driver coupled to the main driver comprising:
an PMOS first driver circuit comprising a first and second PMOS field effect transistors coupled to an PMOS current source field effect transistor, wherein the first resistor of the main drive is coupled serially with the first PMOS field effect transistor of the first drive circuit and the second resistor of the main drive circuit is serially connected to the second PMOS field effect transistor of the first drive circuit; and
a NMOS second driver circuit comprising a first and second NMOS field effect transistor coupled to a third NMOS field effect transistor, the first NMOS field effect transistor individually coupled to the first PMOS field effect transistor of the first driver circuit and the second NMOS field effect transistor individually coupled to the second PMOS field effect transistor of the first driver circuit.

5. A method comprising: operating a current mode main driver circuit to provide a main driver current, wherein the main driver circuit comprises a first and second PMOS field effect transistors coupled to a current source PMOS field effect transistor, wherein a first resistor is serially coupled to the first PMOS field effect transistor and a second resistor is serially coupled to the second PMOS field effect transistor;

operating a de-emphasis driver circuit to provide a de-emphasis driver current, wherein said operating of the de-emphasis driver circuit provides a first current flow through a first driver circuit and a second complementary current flow through a complementary second driver circuit coupled with the first driver circuit, wherein:

the first driver circuit comprises a first and second PMOS field effect transistor coupled to a current source PMOS field effect transistor, wherein the first resistor of the main drive is coupled serially with the first PMOS field effect transistor of the first drive circuit and the second resistor of the main drive circuit is serially connected to the second PMOS field effect transistor of the first drive circuit;

the complementary second driver circuit comprises a first and second NMOS field effect transistor coupled to a third NMOS field effect transistor, the first NMOS field effect transistor individually coupled to the first PMOS field effect transistor of the first driver circuit and the second NMOS field effect transistor individually coupled to the second PMOS field effect transistor of the first driver circuit.

6. The method of claim 5, wherein the circuit is implemented in a PCI Express system.

* * * * *